(12) United States Patent
Goossen (10) Patent No.: US 6,501,589 B1
(45) Date of Patent: Dec. 31, 2002

(54) ARTICLE COMPRISING A METALLIC ANTI-MIRROR

(75) Inventor: Keith W. Goossen, Howell, NJ (US)

(73) Assignee: Aralight, Jamesburg, NJ (US)

( * ) Notice: Subject to any disclaimer, the term of this patent is extended or adjusted under 35 U.S.C. 154(b) by 0 days.

(21) Appl. No.: 09/791,247

(22) Filed: Feb. 22, 2001

(51) Int. Cl.[7] ............................................. G02B 26/00
(52) U.S. Cl. ...................................... 359/290; 359/291
(58) Field of Search ................................. 359/320, 290, 359/299, 298; 430/320; 369/103, 112.09; 385/14, 16, 24; 250/227.11, 227.24; 257/80, 84

(56) References Cited

U.S. PATENT DOCUMENTS

| | | | |
|---|---|---|---|
| 4,782,477 A | * | 11/1988 | Ichihara .................... 269/275.5 |
| 5,241,520 A | * | 8/1993 | Ohta et al. ................ 369/13.42 |
| 5,452,282 A | * | 9/1995 | Abraham ..................... 369/103 |
| 5,665,520 A | * | 9/1997 | Yoshioka .................. 430/270.1 |
| 5,843,626 A | * | 12/1998 | Ohta et al. .................. 430/320 |
| 5,972,461 A | * | 10/1999 | Sandstorm ................. 428/64.3 |
| 6,128,274 A | * | 10/2000 | Mori et al. ............... 369/275.5 |

* cited by examiner

Primary Examiner—Ricky Mack
Assistant Examiner—Omar Hindi
(74) Attorney, Agent, or Firm—DeMont & Breyer, LLC (57) ABSTRACT

An improved opto-electronic device includes a metallic anti-reflection mirror. The metallic anti-reflection mirror has a first metal layer that is disposed on the substrate of the opto-electronic device, a dielectric layer that is disposed on the first metal layer, and second metal layer that is disposed on the dielectric layer. This layer structure, in combination with particular layer thicknesses and materials selection, creates a cavity that enhances the optical field in second metal layer such that any stray light that is generated by or received by the opto-electronic device is substantially absorbed.

25 Claims, 8 Drawing Sheets

ARTICLE COMPRISING A METALLIC ANTI-MIRROR

FIELD OF THE INVENTION

The present invention relates generally to opto-electronic devices, and more particularly, to an apparatus for absorbing stray light that is generated in or received by opto-electronic devices.

BACKGROUND OF THE INVENTION

The performance of light-emitting and light-receiving opto-electronic devices is compromised by stray light. Simply stated, stray light is light that, from the perspective of opto-electronic device performance, is in the wrong place at the wrong time. In some cases (e.g., lasers, etc.), stray light is generated by the opto-electronic device itself, in others (e.g., optical modulators, etc.), stray light originates from an external source. In either case, stray light causes problems, as the following examples illustrate.

Figure 1:
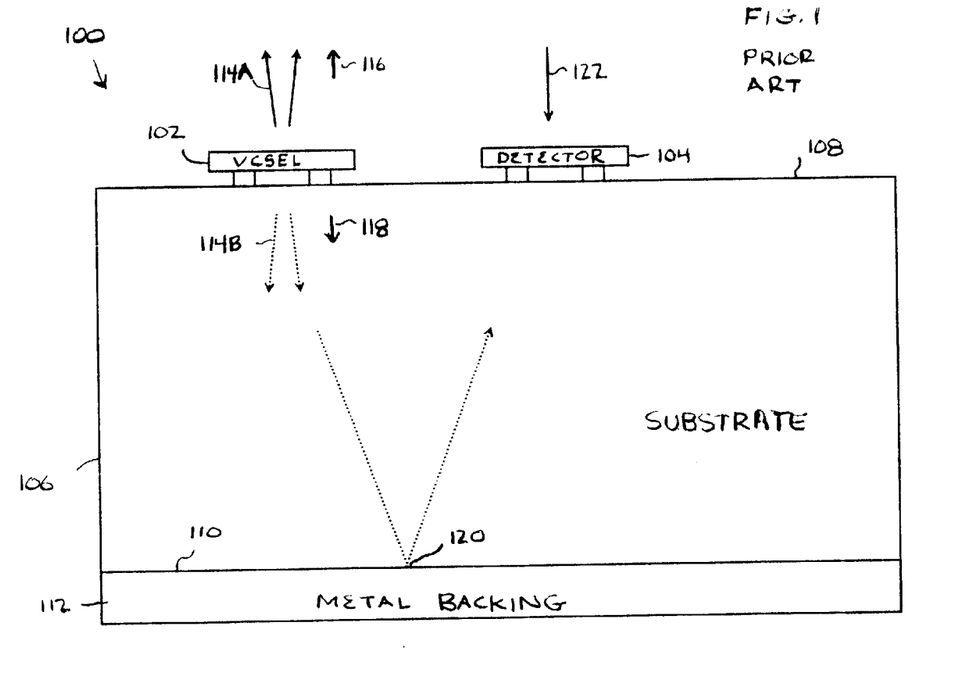
FIG. 1 depicts an illustration of a first prior art opto-electronic device comprising a vertical cavity surface emitting laser and a photodetector that are co-located on a semiconductor circuitry chip.

FIG. 1 depicts an illustration of opto-electronic device 100, which comprises vertical cavity surface emitting laser ("VCSEL") 102 and photodetector 104 that are co-located on first major surface 108 of substrate 106. The substrate comprises electronic driver circuitry (not depicted) for energizing VCSEL 102. Opto-electronic device 100 also incorporates a heat sink (not depicted) that removes the heat that is generated by the electronic driver circuitry and VCSEL 102. Metal backing 112, which is disposed on second major surface 110 of substrate 106, is used to attach the heat sink to substrate 106.

VCSEL 102 is configured to emit output light 114A away from semiconductor circuitry chip 106 in direction 116. But as a result of design and manufacturing compromises, a portion of the output light from VCSEL 102, ray of stray light 114B, is typically emitted toward substrate 106 in direction 118.

The substrate of an opto-electronic device is often transparent to light. For example, substrate 106 is transparent to light having a wavelength of 1.3 microns, an important telecommunications wavelength, when the substrate is made of silicon. In such a case, stray light 114B that is emitted in direction 118 passes through substrate 106, reflects off of metal backing 112 (e.g., at location 120) and is redirected toward first major surface 108.

At first major surface 108, stray light 114B might be received by parts of opto-electronic device 100 that are light sensitive, such as photodetector 104. If stray light 114B is received and absorbed by photodetector 104, cross-talk between input signal 122 and output signal 114A occurs.

Figure 2:
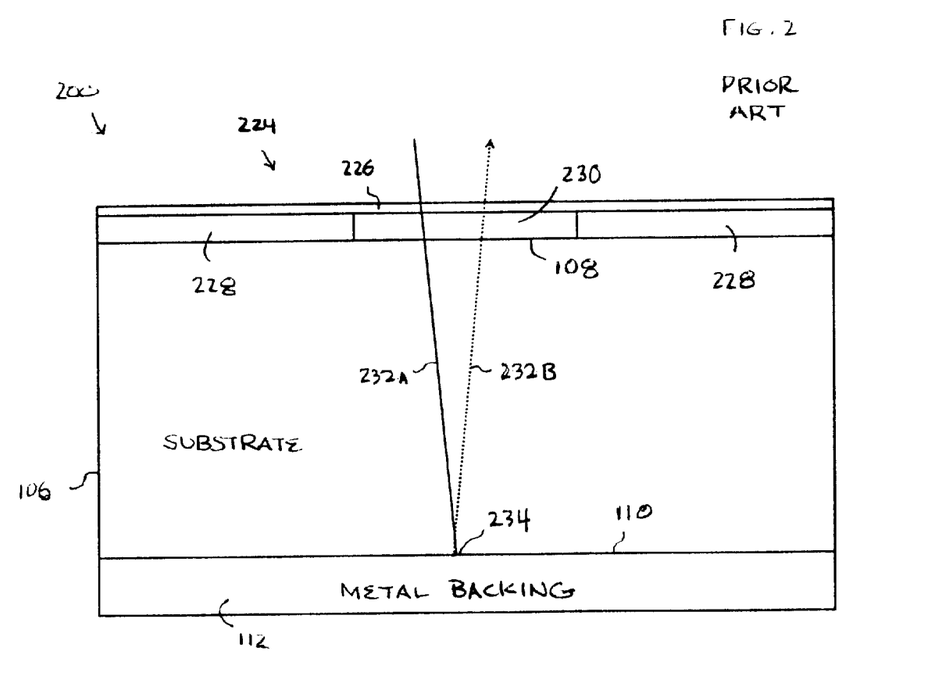
FIG. 2 depicts an illustration of second prior art opto-electronic device comprising a micro-mechanical optical modulator.

FIG. 2 depicts an illustration of opto-electronic device 200. This opto-electronic device comprises micro-mechanical optical modulator 224, the design and operation of which are well-known in the art. The modulator includes membrane 226 that is supported by supports 228 over first major surface 108 of substrate 106. Cavity 230 is formed in the region between membrane 226 and first major surface 108. In micro-mechanical optical modulator 224, substrate 106 is not an active device.

When actuated, such as by an applied voltage, membrane 226 moves toward substrate 230. As membrane 226 moves, the size of cavity 234 (i.e., the distance or gap between the membrane and first major surface 108) changes. This change alters the reflectivity of modulator 224 and, as such, modulator 224 is capable of modulating reflected light. See, for example, U.S. Pat. No. 5,500,761.

In many of the applications for modulator 224, substrate 106 is transparent to light. For example, substrate 106 is transparent to light having a wavelength of 1.55 microns, another important telecommunications wavelength, when the substrate is made of silicon. To prevent stray light from passing out of substrate 106 and into, for example, an output port (not depicted), metal-backing 112 is advantageously disposed on second major surface 110 of substrate 106. Consequently, when modulator 224 is in a low-reflectivity state, most of light 232A that is received by modulator 224 passes through substrate 106 and is reflected off metal backing 112 (e.g., at location 234). Reflected (ie., stray) light 232B adds to the overall reflected signal thereby degrading the contrast (i.e., the ratio of maximum reflectivity to minimum reflectivity) of modulator 224.

The problems caused by stray light in two different types of opto-electronic devices have been discussed above. And it will be understood that stray light causes similar problems in other types of opto-electronic devices as well. Therefore, incorporating a means to capture stray light in opto-electronic devices would improve such devices and, more generally, benefit this art.

SUMMARY OF THE INVENTION

In accordance with the present invention, the performance of opto-electronic devices is improved by a metallic anti-mirror. The metallic anti-mirror, which is disposed on a substrate of an opto-electronic device, substantially absorbs stray light that is generated by or received by the opto-electronic device.

In accordance with the illustrative embodiment of the present invention, metallic anti-reflection mirror comprises a first metal layer that is disposed on the substrate of an opto-electronic device, a dielectric layer that is disposed on the first metal layer, and a second metal layer that is disposed on the dielectric layer. This arrangement of layers, when of suitable thickness, creates a cavity that enhances the optical field in second metal layer. While the metal layers can comprise virtually any metal, those that adhere well to the substrate and dielectric layer (e.g., aluminum, chromium, etc.) are advantageously used.

Specific values of the thickness of the first metal layer and the dielectric layer will produce a metallic anti-reflection mirror that completely absorbs light (i.e., has zero reflectivity). These values are dependent on the wavelength of the light and the composition of the materials comprising the various layers. Deviations in thickness will result in an increase in the reflectivity of the anti-reflection mirror. Typically, the first metal layer has a thickness that is in a range between about 100 angstroms and about 400 angstroms and the dielectric layer has a thickness that is in a range between about 750 angstroms to about 4500 angstroms.

In one variation of a metallic anti-reflection mirror in accordance with the illustrative embodiment of the present invention, the second metal layer is partitioned into a first sub-layer and a second sub-layer. The first sub-layer is disposed on the dielectric layer,.and the second sub-layer is disposed on the first sub-layer. The second sub-layer comprises a metal, such as gold or aluminum, that advantageously protects the first sub-layer from oxidation.

DETAILED DESCRIPTION OF THE ILLUSTRATIVE EMBODIMENT

The terms listed below are given the following specific definitions for the purposes of this specification:

Opto-electronic device refers to a device that generates light, such as, for example, a laser and a light emitting diode. The term "opto-electronic device" also refers to a device that receives light and changes a characteristic thereof, such as its intensity, phase, polarization or direction. This change can be caused in many different ways using any of a variety of underlying principles or effects. For example, the intensity of light can be changed using an optical interference effect via a micro-electromechanical modulator. Additionally, altering the value of a property of semiconductors, crystals or other materials can cause a change in the light propagating therein. Mechanisms or principles by which the value of a property, such as the refractive index, of semiconductors, crystals and other materials can be changed include, without limitation: an electro-optic effect (i.e., a change in complex [both real and imaginary] refractive index with applied electric field), a photoelastic effect (i.e., an induced strain in a crystal leading to a shift in real refractive index), a plasma effect (i.e., a change in complex refractive index caused by electrically or optically inducing changes in carrier concentration), and an electro-refraction effect in quantum wells (i.e., a change in real refractive index due to the quantum-confined Stark effect and an applied electric field). Examples of devices in which a value of a property of a semiconductor, crystal or other material is altered include, without limitation, semiconductor modulators, surface acoustic wave modulators and quantum well modulators. The term "opto-electronic device" also refers to a device (e.g., a photodetector) that receives light and generates electron/holes pairs. Furthermore, the term "opto-electronic device" refers to combinations of the types of devices described above. The devices can be combined at the wafer, pc-board or other hierarchical levels.

Optically infinitely thick means, when used to characterize the thickness of a layer of material, that light cannot pass completely through the layer. That is, the layer is opaque. A layer of metal that has a thickness of at least about 1000 angstroms is considered to be optically infinitely thick for the purposes of this specification.

Dielectric material means a non-metallic material that is transparent to light at the relevant wavelengths.

Satisfactorily adhere means that a first material adheres well enough to a second material to pass a test that those skilled in the art use to gauge adherence. A variety of such tests are known in the art, and include, without limitation, the "tape" test, bending test, squashing test, heating test, ultrasonic vibration testing, ultracentrifuge testing and the like. See, Maissel and Glange, *Thin Film Technology*, Chapter 12 (McGraw Hill© 1970). Materials considered to "satisfactorily adhere" to a semiconductor substrate or most dielectric materials include, without limitation, aluminum, chromium, nickel, titanium and tungsten.

Optical thickness means the thickness of a layer of material, expressed as a fraction of the operating wavelength, (e.g., $\lambda/2$, etc.) as measured in the material. Optical thickness is given by the formula:

$$\text{O.T.} = (\text{actual thickness of layer /operating wavelength}) \times \text{refractive index of the layer.} \quad [1]$$

Half-wave thickness or thickness of $\lambda/2$ means, when used to characterized the thickness of a layer of material, an optical thickness of one-half of the operating or design wavelength $\lambda$.

Figure 3:
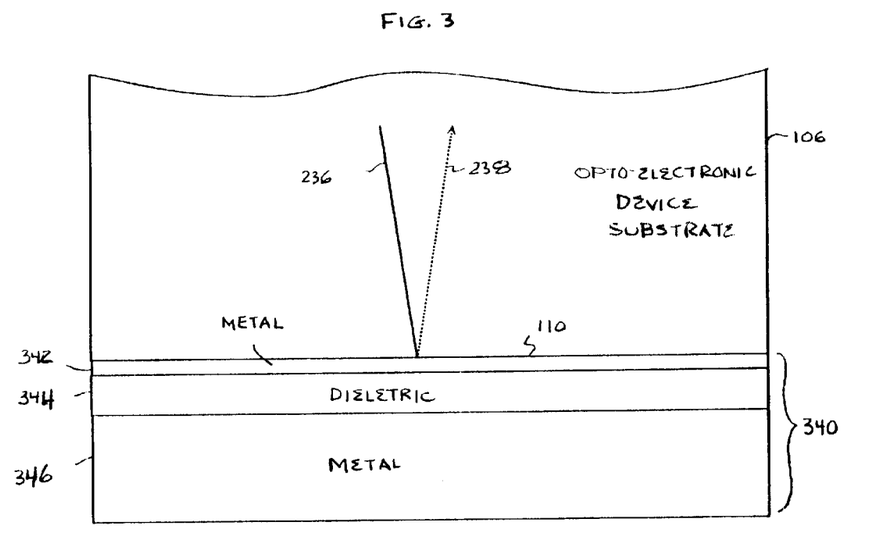
FIG. 3 depicts a metallic anti-mirror in accordance with the illustrative embodiment of the present invention.

FIG. 3 depicts metallic anti-reflection mirror 340 in accordance with the illustrative embodiment of the present invention. Metallic anti-reflection mirror 340 is disposed on substrate 106 of an opto-electronic device. Substrate 106 typically comprises a semiconductor, such as silicon or germanium. Alternatively, substrate 106 can be quartz.

Metallic anti-reflection mirror 340 comprises first metal layer 342, dielectric layer 344 and second metal layer 346, arranged as shown. The arrangement of layers disclosed herein creates a cavity that enhances the optical field in second metal layer 346. In fact, when the thickness of first metal layer 342 and dielectric layer 344 are suitably chosen, metallic anti-reflection mirror 340 substantially completely absorbs light (i.e., zero reflectivity).

First metal layer 342 is disposed on second major surface 110 of substrate 106. First metal layer 342 is suitably thin so that it is substantially transparent to stray light, such as stray light 236. Such transparency is obtained with a metal layer having a thickness that is less than about 1000 angstroms. More typically, first metal layer 342 has a thickness that is in a range between about 100 angstroms and about 400 angstroms.

First metal layer 342 can be any metal; however, the metal selected will advantageously satisfactorily adhere to substrate 106. Examples of metals that satisfactorily adhere to most types of semiconductor substrates (e.g., silicon, germanium, etc.) include aluminum, chromium, nickel, titanium and tungsten.

Dielectric layer 344 is disposed on first metal layer 342. Dielectric layer 344 comprises a dielectric material. Suitable dielectric materials include, without limitation, silicon monoxide, silicon dioxide, silicon nitride, aluminum oxide, zinc sulfide, manganese fluoride and sapphire. Furthermore, dielectric layer 344 can be a gas, such as air. In such a variation, first metal layer 342 and second metal layer 344 are spaced apart by a support (not shown). Dielectric layer 344 has a thickness that is typically in a range between about 750 angstroms to about 4500 angstroms.

Second metal layer 346 is disposed on dielectric layer 344. Second metal layer 346 is suitably thick so that it is optically infinitely thick. A 1000-angstrom thickness of metal is sufficient for this purpose. Like first metal layer 342, second metal layer 346 can comprise any metal. And second metal layer 346 can comprise the same metal or a different metal than first metal layer 342. The metal selected will advantageously satisfactorily adhere to dielectric layer 344.

Figure 4:
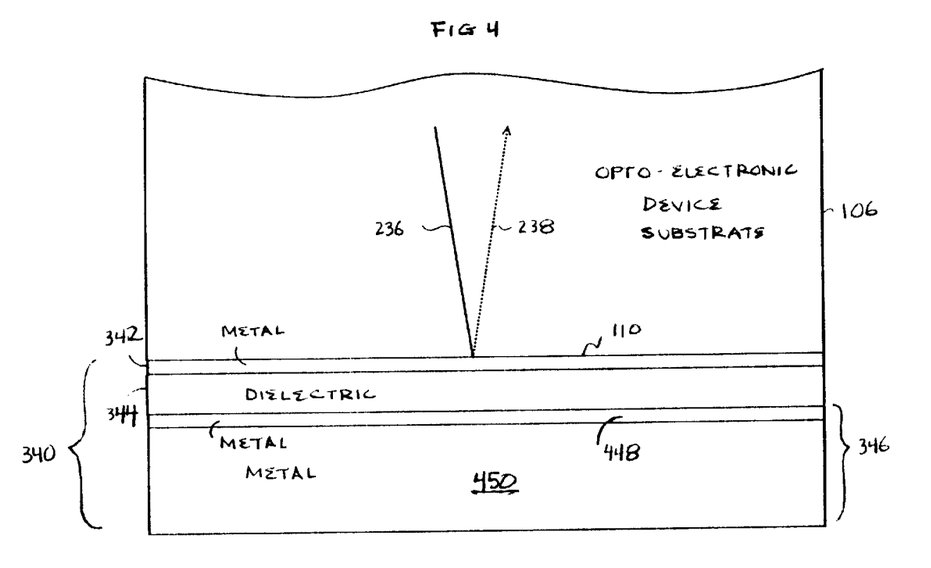
FIG. 4 depicts a variation of the metallic anti-mirror shown in FIG. 3.

FIG. 4 depicts a first variation of metallic anti-reflection mirror 340 shown in FIG. 3. In this variation, second metal layer 346 is partitioned into first sub-layer 448 and second sub-layer 450. First sub-layer 448 is disposed on dielectric layer 344, and second sub-layer 450 is disposed on first sub-layer 448. Second sub-layer 450 comprises a metal, such as gold or aluminum, that advantageously protects first sub-layer 448 from oxidation.

The thickness of first metal layer 342 and dielectric layer 344 control the reflectivity of metallic anti-reflection mirror 340, as a function of materials selection and the wavelength of the light. The reflectivity of metallic anti-reflection mirror 340 is obtained by simply selecting values for the thickness of first metal layer 342 and dielectric layer 344 and then solving well known expressions for the reflectivity of thin films. See, e.g., Macleod, *Thin Film Optical Filters*, pg. 35, (Adam Hilger Ltd., Bristol © 1986).

As previously disclosed, first metal layer 342 must be thin enough to be transparent, and, as a consequence, is restricted to a thickness that is less than 1000 angstroms. The optical behavior of metallic anti-reflection mirror 340 repeats every half-wave thickness of dielectric layer 344. Consequently, the behavior of metallic anti-reflection mirror 340 can be fully characterized by examining reflectivity for values of the thickness of first metal layer 342 less than 1000 angstroms and for values of dielectric layer 344 between some minimum thickness (e.g., 100–200 angstroms) and a maximum thickness of $\lambda/2$. Typically, reflectivity will be calculated for a maximum thickness of dielectric layer 344 that is less than $\lambda/2$. This is because the reflectivity of metallic anti-reflection mirror 340 will most likely rise to a value that is unacceptably high before the full range of dielectric layer 344 thickness up to $\lambda/2$ is examined.

FIGS. 5–10 depict contour plots showing anti-mirror reflectivity as a function of the thickness of first metal layer 342 and the thickness of dielectric layer 344, for several wavelengths, for several values of refractive index of dielectric layer and for various compositions of the metal layers.

Figure 5:
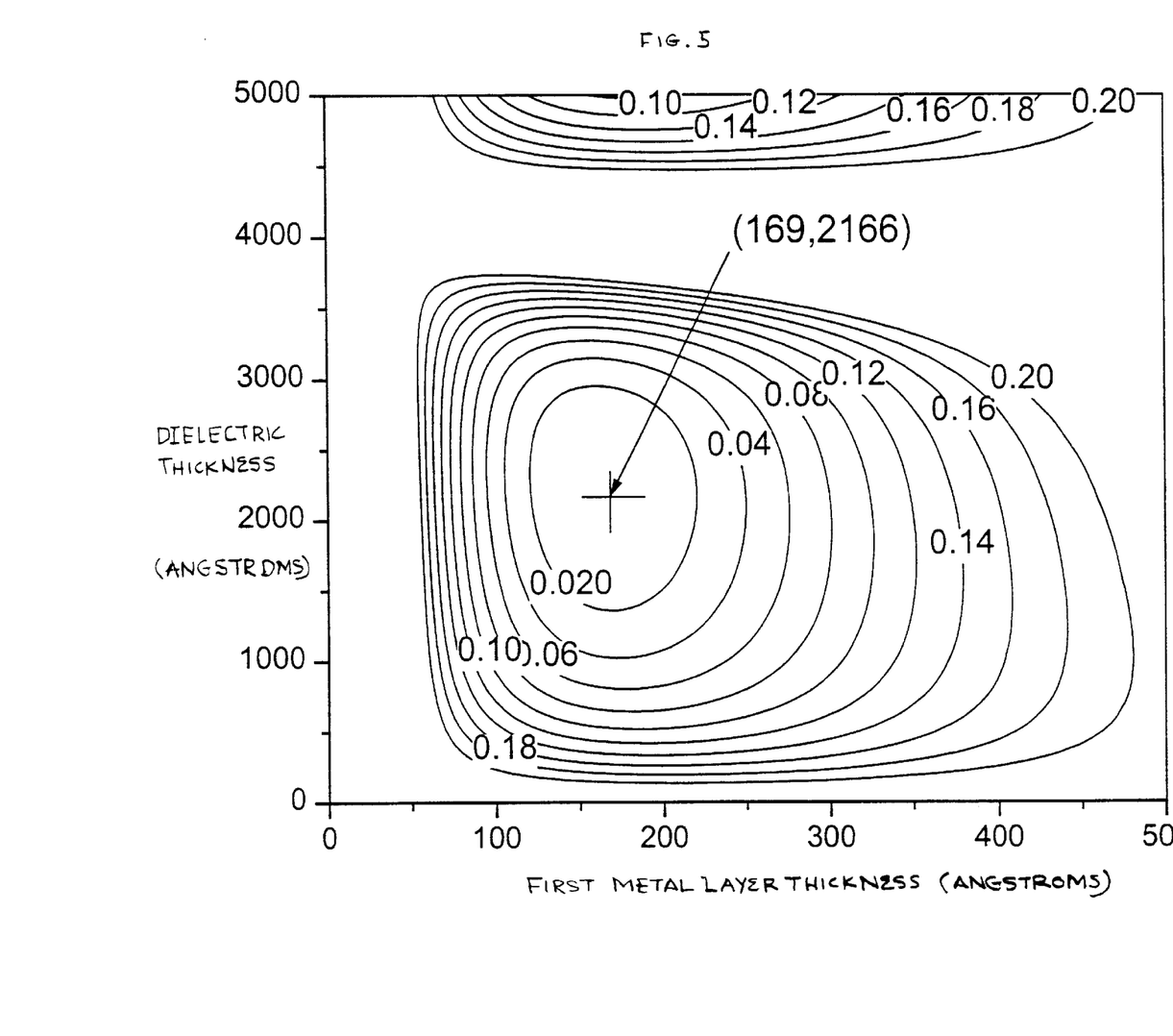
FIG. 5 depicts a contour plot showing anti-mirror reflectivity as a function of the thickness of the first metal layer and the thickness of the dielectric layer, wherein the optical signal has a wavelength of 1300 nanometers, the substrate is silicon, the dielectric layer has a refractive index of 1.5, the first metal layer is chromium and the second metal layer is chromium.

FIG. 5 depicts a first contour plot showing anti-mirror reflectivity wherein the optical signal has a wavelength of 1300 nanometers, the substrate is silicon, the dielectric layer has a refractive index of 1.5, the first metal layer is chromium and the second metal layer is chromium.

Referring to FIG. 5, the reflectivity of metallic anti-mirror 340 is about zero when first metal layer 342 has a thickness of 169 angstroms and dielectric layer 344 has a thickness of 2,166 angstroms (for the specific composition and wavelength indicated above).

FIG. 5 shows that metallic anti-mirror 340 is completely absorbing at only one specific pair of values (i.e., 169 angstroms and 2166 angstroms). Depending upon application specifics (e.g., the particular opto-electronic device with which the anti-mirror is used and the application for the opto-electronic device), zero reflectivity performance might not be required. That is, in some cases, operating metallic anti-mirror 340 at two-percent reflectivity or four-percent reflectivity or more might provide acceptable performance.

If metallic anti-reflection mirror 340 is allowed to operate with a small but non-zero reflectivity, far more latitude in the thickness of first metal layer 342 and dielectric layer 344 is permitted. For example, the reflectivity of metallic anti-mirror 340 is four percent or less when first metal layer 342 has a thickness that is between about 110 angstroms and about 250 angstroms and dielectric layer 344 has a thickness that is between about 1,000 angstroms and 3,150 angstroms.

Figure 6:
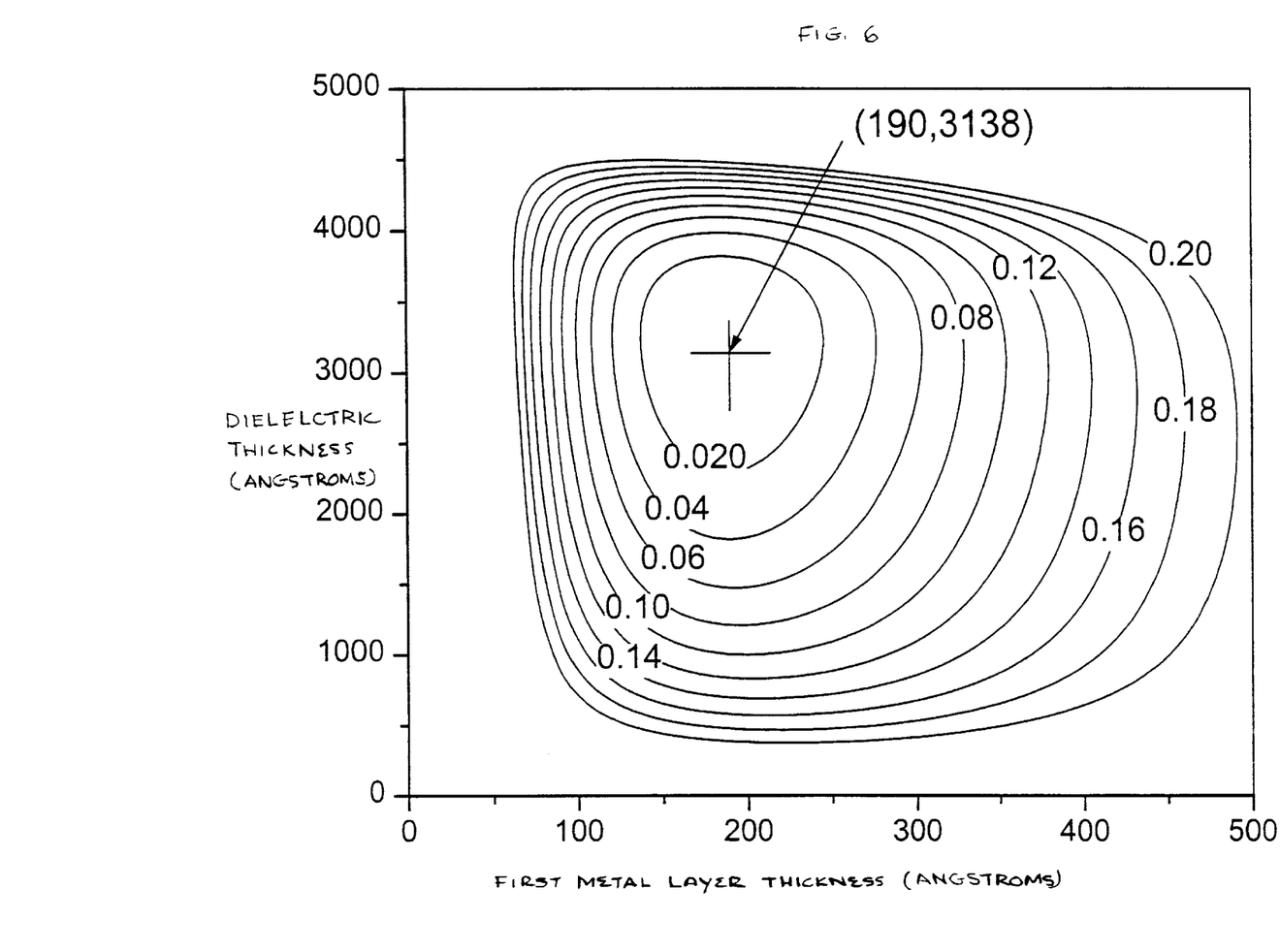
FIG. 6 depicts a contour plot showing anti-mirror reflectivity as a function of the thickness of the first metal layer and the thickness of the dielectric layer, wherein the optical signal has a wavelength of 1570 nanometers, the substrate is silicon, the dielectric layer has a refractive index of 1.5, the first metal layer is chromium and the second metal layer is chromium.

FIG. 6 depicts a contour plot showing anti-mirror reflectivity wherein the optical signal has a wavelength of 1570 nanometers, the substrate is silicon, the dielectric layer has a refractive index of 1.5, the first metal layer is chromium and the second metal layer is chromium.

Referring to FIG. 6, the reflectivity of metallic anti-mirror 340 is about zero when first metal layer 342 has a thickness of 190 angstroms and dielectric layer 344 has a thickness of 3,138 angstroms (for the specific composition and wavelength indicated above). The reflectivity of metallic anti-mirror 340 is four percent or less when first metal layer 342 has a thickness that is between about 120 angstroms and about 245 angstroms and dielectric layer 344 has thickness that is between about 1,800 angstroms and about 4,000 angstroms.

Comparing FIG. 5 to FIG. 6 shows the effect of increasing the wavelength of the optical signal from 1300 nanometers to 1570 nanometers. As these Figures show, increasing the wavelength results in an increase in the thickness of both first metal layer 342 and dielectric layer 344 for comparable reflectivity.

Figure 7:
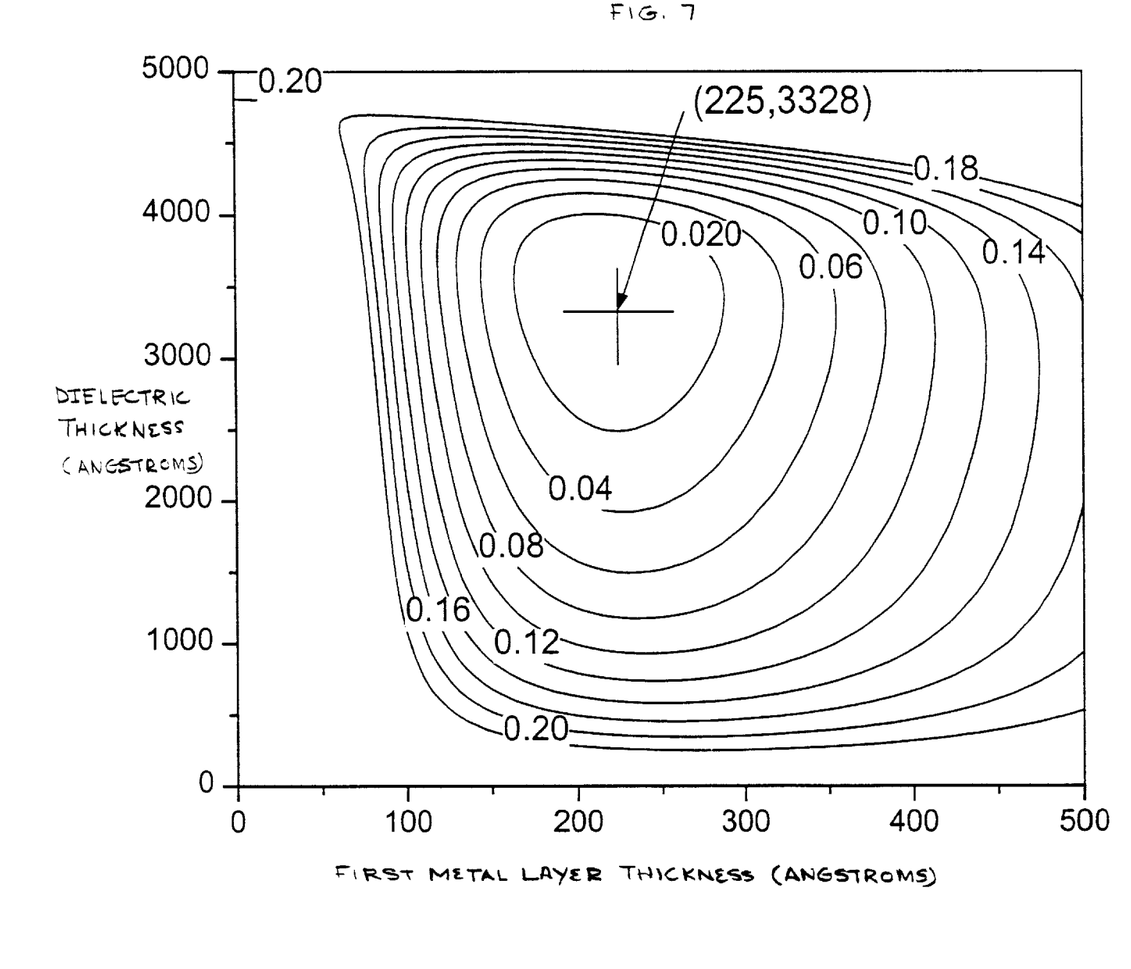
FIG. 7 depicts a contour plot showing anti-mirror reflectivity as a function of the thickness of the first metal layer and the thickness of the dielectric layer, wherein the optical signal has a wavelength of 1570 nanometers, the substrate is germanium, the dielectric layer has a refractive index of 1.5, the first metal layer is chromium and the second metal layer is chromium.

FIG. 7 depicts a contour plot showing anti-mirror reflectivity wherein the optical signal has a wavelength of 1570 nanometers, the substrate is germanium, the dielectric layer has a refractive index of 1.5, the first metal layer is chromium and the second metal layer is chromium.

Referring to FIG. 7, the reflectivity of metallic anti-mirror 340 is about zero when first metal layer 342 has a thickness of 225 angstroms and dielectric layer 344 has a thickness of 3,328 angstroms (for the specific composition and wavelength indicated above). The reflectivity of metallic anti-mirror 340 is four percent or less when first metal layer 342 has a thickness that is between about 160 angstroms and about 280 angstroms and dielectric layer 344 has a thickness that is between about 1,900 angstroms to about 4,100 angstroms.

Comparing FIG. 6 to FIG. 7 shows the effect of changing the substrate from silicon to germanium. As these Figures show, changing the substrate to germanium from silicon requires an increase in the thickness of both first metal layer 342 and dielectric layer 344 for comparable reflectivity.

Figure 8:
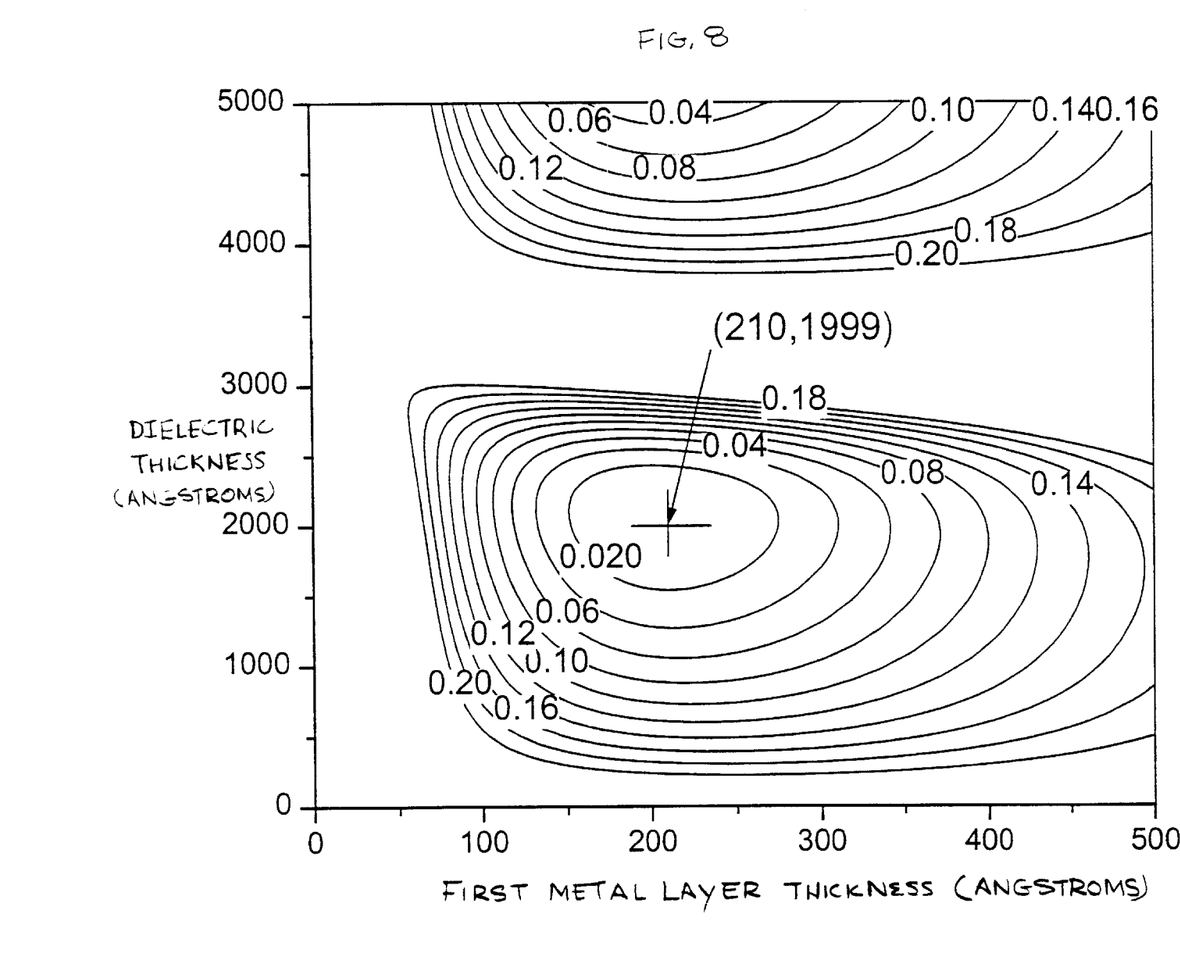
FIG. 8 depicts a contour plot showing anti-mirror reflectivity as a function of the thickness of the first metal layer and the thickness of the dielectric layer, wherein the optical signal has a wavelength of 1570 nanometers, the substrate is germanium, the dielectric layer has a refractive index of 2, the first metal layer is chromium and the second metal layer is chromium.

FIG. 8 depicts a contour plot showing anti-mirror reflectivity wherein the optical signal has a wavelength of 1570 nanometers, the substrate is germanium, the dielectric layer has a refractive index of 2, the first metal layer is chromium and the second metal layer is chromium.

Referring to FIG. 8, the reflectivity of metallic anti-mirror 340 is about zero when first metal layer 342 has a thickness of 210 angstroms and dielectric layer 344 has a thickness of 1,999 angstroms (for the specific composition and wavelength indicated above). The reflectivity of metallic anti-mirror 340 is four percent or less when first metal layer 342 has a thickness that is between about 130 angstroms and about 315 angstroms and dielectric layer 344 has a thickness that is between about 1,250 angstroms and 2,550 angstroms.

Comparing FIG. 7 to FIG. 8 shows the effect of increasing the refractive index of dielectric layer 344 from 1.5 to 2. As these Figures show, this increase in refractive index results in a decrease in the thickness of both first metal layer 342 and dielectric layer 344 for comparable reflectivity.

Figure 9:
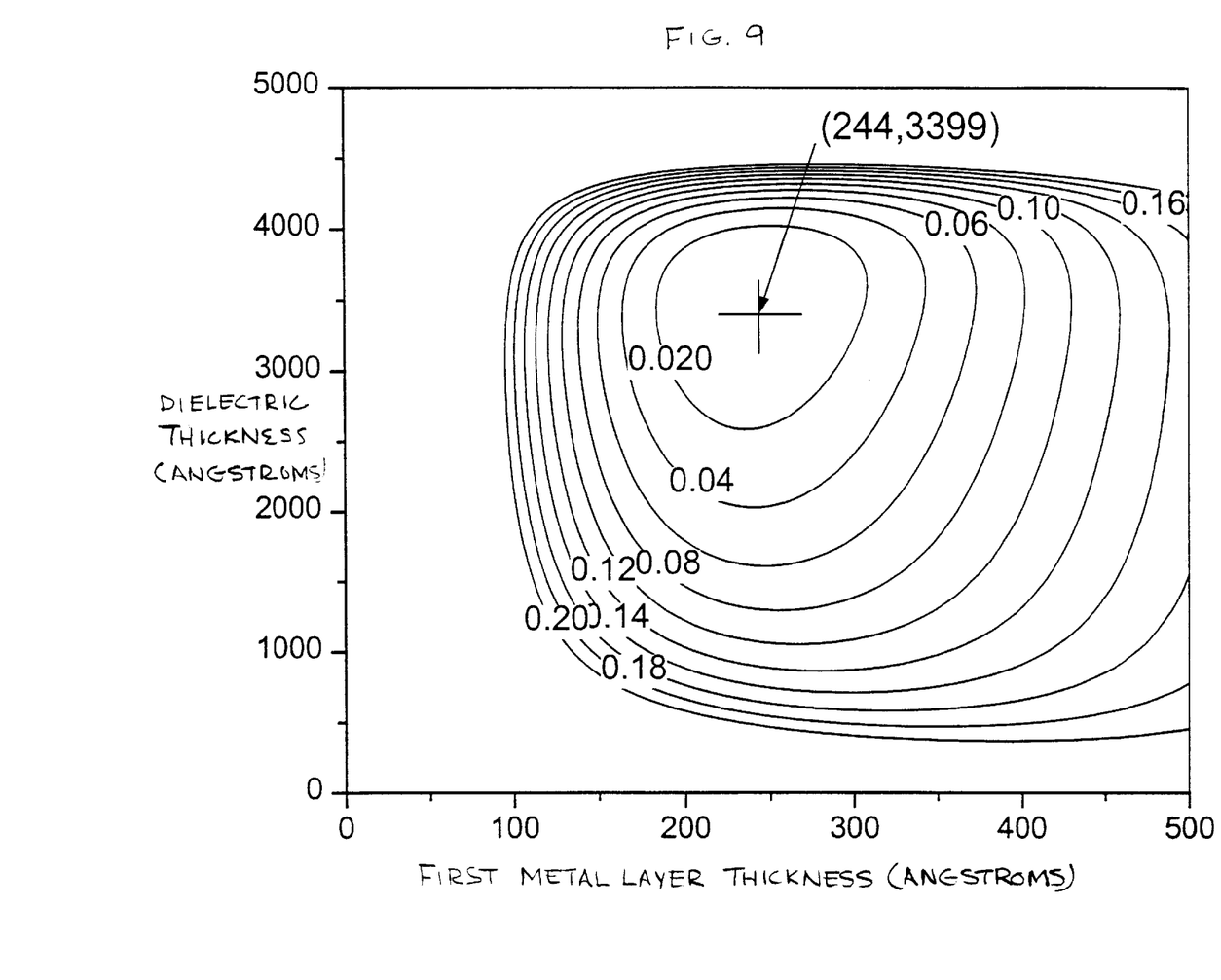
FIG. 9 depicts a contour plot showing anti-mirror reflectivity as a function of the thickness of the first metal layer and the thickness of the dielectric layer, wherein the optical signal has a wavelength of 1570 nanometers, the substrate is germanium, the dielectric layer has a refractive index of 1.5 the first metal layer is chromium and the second metal layer is gold.

FIG. 9 depicts a contour plot showing anti-mirror reflectivity wherein the optical signal has a wavelength of 1570 nanometers, the substrate is germanium, the dielectric layer has a refractive index of 1.5 the first metal layer is chromium and the second metal layer is gold.

Referring to FIG. 9, the reflectivity of metallic anti-mirror 340 is about zero when first metal layer 342 has a thickness of 244 angstroms and dielectric layer 344 has a thickness of 3,399 angstroms (for the specific composition and wavelength indicated above). The reflectivity of metallic anti-mirror 340 is four percent or less when first metal layer 342 has a thickness that is between about 165 angstroms and about 345 angstroms and dielectric layer 344 has a thickness that is between about 2,000 angstroms and about 4,150 angstroms.

Comparing FIG. 7 to FIG. 9 shows the effect of changing second metal layer 346 from chromium to gold. As these Figures show, this change in materials composition results in a slight increase in the thickness of both first metal layer 342 and dielectric layer 344 for comparable reflectivity.

Figure 10:
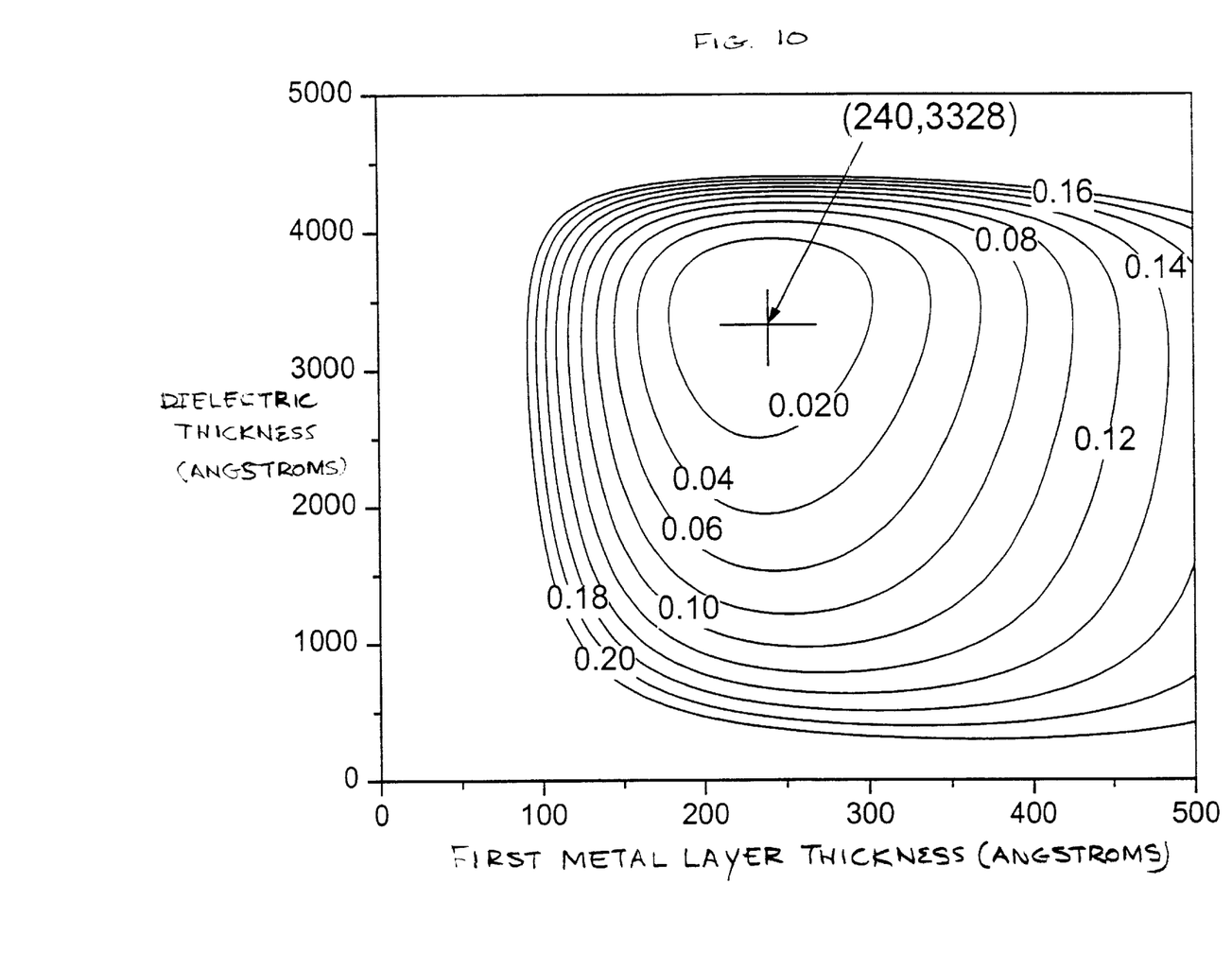
FIG. 10 depicts a contour plot showing anti-mirror reflectivity as a function of the thickness of the first metal layer and the thickness of the dielectric layer, wherein the optical signal has a wavelength of 1570 nanometers, the substrate is germanium, the dielectric layer has a refractive index of 1.5 the first metal layer is chromium and the second metal layer has a first sub-layer of chromium and a second sub-layer of gold.

FIG. 10 depicts a contour plot showing anti-mirror reflectivity wherein the optical signal has a wavelength of 1570 nanometers, the substrate is germanium, the dielectric layer has a refractive index of 1.5 the first metal layer is chromium and the second metal layer has a first sub-layer of chromium and a second sub-layer of gold.

Referring to FIG. 10, the reflectivity of metallic anti-mirror 340 is about zero when first metal layer 342 has a thickness of 240 angstroms and dielectric layer 344 has a thickness of 3,328 angstroms (for the specific composition and wavelength indicated above). The reflectivity of metallic anti-mirror 340 is four percent or less when first metal layer 342 has a thickness that is between about 160 angstroms and about 340 angstroms and dielectric layer 344 has a thickness that is between about 1,925 angstroms and about 4,075 angstroms.

Comparing FIGS. 7 and 9 to FIG. 10 shows the effect on layer thickness when second metal layer 346 into partitioned into two sub-layers 448 and 450, wherein first sub-layer 448 comprises chromium and second sub-layer 450 comprises gold.

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

I claim:

1. An article comprising an opto-electronic device and an anti-mirror disposed on opposed sides of a substrate, said anti-mirror comprising:
   a first metal layer disposed on said substrate, wherein said first metal layer is substantially transparent to an optical signal;
   a second metal layer that is spaced apart from said first metal layer, wherein said second metal is optically infinitely thick; and
   a dielectric material in the space between said first metal layer and said second metal layer.

2. The article of claim 1 wherein said substrate is selected from the group consisting of silicon and germanium.

3. The article of claim 1 wherein said first metal layer has a thickness that is in a range of 100 angstroms to 400 angstroms.

4. The article of claim 3 wherein said dielectric material has a thickness that is in a range of 750 angstroms to 4500 angstroms.

5. The article of claim 4 wherein said substrate is silicon, and said first metal layer has a thickness that is less than 250 angstroms.

6. The article of claim 5 wherein said first metal layer comprises a first metal that satisfactorily adheres to said substrate.

7. The article of claim 6 wherein said second metal layer comprises a second metal that satisfactorily adheres to said dielectric material.

8. The article of claim 7 wherein said first metal and said second metal are individually selected from the group consisting of aluminum, chromium, nickel, titanium and tungsten.

9. The article of claim 4 wherein:
   said first metal layer comprises a first metal;
   said second metal layer has a first sub-layer that is disposed on said dielectric material, wherein said first sub-layer comprises a second metal; and
   said second metal layer has a second sub-layer that is disposed on said first sub-layer, wherein said second sub-layer comprises a third metal.

10. The article of claim 9 wherein said first metal and said second metal are the same metal.

11. The article of claim 9 wherein said second metal satisfactorily adheres to said dielectric material and said third metal is suitable for protecting said second metal against oxidation.

12. The article of claim 11 wherein said third metal comprises gold.

13. The article of claim 1 wherein said opto-electronic device is a vertical cavity surface emitting laser.

14. The article of claim 13 further comprising a second opto-electronic device, wherein said second opto-electronic device is a photodetector.

15. The article of claim 1 wherein said opto-electronic device is an optical modulator.

16. An article comprising:
   a substrate;
   a first layer comprising a first metal, wherein:
      said first layer is disposed on a first surface of said substrate; and said first layer is substantially transparent to an optical signal;

a second layer comprising a dielectric material that is disposed on said first layer; and a third layer comprising a second metal, wherein:
said third layer is disposed on said second layer; and
said third layer is optically infinitely thick.

17. The article of claim 16 further comprising an opto-electronic device that is disposed on a second surface of said substrate.

18. The article of claim 17 wherein said opto-electronic device is a vertical cavity surface emitting laser.

19. The article of claim 16 wherein said third layer comprises:
a first sub-layer disposed on said second layer, said first sub-layer comprising said second metal, wherein said second metal satisfactorily adheres to said dielectric material; and
a second sub-layer disposed on said first sub-layer, said second sub-layer comprising a third metal, said third metal suitable for protecting said first sub-layer against oxidation.

20. The article of claim 16 wherein said first layer has a thickness that is in a range of 100 angstroms to 400 angstroms.

21. The article of claim 16 wherein said dielectric material has a thickness that is in a range of 750 angstroms to 4500 angstroms.

22. The article of claim 16 wherein said first metal is the same metal as said second metal.

23. The article of claim 16 wherein said first metal is selected from the group consisting of aluminum, chromium, nickel, titanium and tungsten.

24. The article of claim 19 wherein said third metal comprises gold.

25. An opto-electronic device comprising, a substrate comprising a semiconductor;

a plurality of device layers that are disposed on a first major surface of said substrate;

a first metal layer disposed on a second major surface of said substrate, wherein said first metal layer is transparent to light at at least one wavelength;

a non-metallic layer that is disposed on said first metal layer; and a second metal layer that is disposed on said non-metallic layer, wherein said second metal layer is optically infinitely thick.

* * * * *